United States Patent
Rivoirard

(10) Patent No.: US 9,515,609 B1
(45) Date of Patent: Dec. 6, 2016

(54) PASSIVE MIXER WITH DUTY CYCLE IMPROVEMENT THROUGH HARMONICS LEVEL REDUCTION

(71) Applicant: STMicroelectronics (Alps) SAS, Grenoble (FR)

(72) Inventor: Frederic Rivoirard, Fontaine (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 14/986,421

(22) Filed: Dec. 31, 2015

(51) Int. Cl.
| | | |
|---|---|---|
| *H03B 19/00* | (2006.01) | |
| *G06F 7/44* | (2006.01) | |
| *H03D 7/14* | (2006.01) | |
| *H03K 5/1252* | (2006.01) | |

(52) U.S. Cl.
CPC .......... *H03D 7/1466* (2013.01); *H03K 5/1252* (2013.01)

(58) Field of Classification Search
CPC .......................... H03D 7/1466; H03K 5/1252
USPC ......................................... 327/122, 356, 359
See application file for complete search history.

(56) References Cited

U.S. PATENT DOCUMENTS

| | | | | |
|---|---|---|---|---|
| 5,180,994 A * | 1/1993 | Martin | ................... | H03B 27/00 331/38 |
| 6,816,021 B2 * | 11/2004 | Hahn | ................... | H03B 21/025 327/105 |
| 7,091,757 B2 * | 8/2006 | Masuda | ................ | H03B 19/00 327/113 |
| 7,302,011 B1 * | 11/2007 | Granger-Jones | .......... | G06F 7/68 329/347 |
| 7,302,248 B2 * | 11/2007 | Craninckx | ............. | H03B 27/00 455/302 |
| 7,312,669 B2 * | 12/2007 | Kinoshita | ............ | H03K 3/0322 331/12 |
| 7,340,233 B2 * | 3/2008 | Shemesh | .............. | H03D 7/1441 327/116 |
| 7,459,947 B2 * | 12/2008 | Ito | .......................... | H03B 19/14 327/116 |
| 7,804,932 B2 * | 9/2010 | Kravitz | ................ | H03B 21/025 327/115 |
| 8,275,817 B2 * | 9/2012 | Petrovic | ................. | H03B 19/06 708/200 |
| 8,938,204 B2 * | 1/2015 | Oishi | ..................... | H03B 21/01 327/119 |

* cited by examiner

*Primary Examiner* — Kenneth B Wells
(74) *Attorney, Agent, or Firm* — Seed IP Law Group LLP

(57) ABSTRACT

A signal generation circuit includes a voltage controlled oscillator configured to generate a differential oscillator signal having an amplitude. A passive mixer has first differential inputs coupled to the voltage controlled oscillator to receive the oscillator signal. The passive mixer also includes second differential inputs. A filter circuit is coupled between the voltage controlled oscillator and the second differential inputs of the passive mixer. The filter circuit is configured to filter the differential oscillator signal as a function of the amplitude of the differential oscillator signal to thereby generate a filtered differential oscillator signal and to provide the filtered differential oscillator signal to the second differential inputs of the passive mixer.

20 Claims, 7 Drawing Sheets

PASSIVE MIXER WITH DUTY CYCLE IMPROVEMENT THROUGH HARMONICS LEVEL REDUCTION

BACKGROUND

Technical Field

The present disclosure relates generally to high frequency signal generation circuits, and more specifically to high frequency signal generation circuits utilizing a passive mixer circuit to generate a high frequency local oscillator signal.

Description of the Related Art

Most all electronic devices include various wired and wireless communications interfaces for communicating among components within the device and with external devices and networks. A typical laptop computer, for example, will include one or more Universal Serial Bus (USB) communication ports as well as Peripheral Connect Interface (PCI) Express (PCIe) communications ports for communication with video cards, storage devices, and other components of the laptop. Current versions of these USB and PCIe communications protocols utilize very high frequency Gigahertz (GHz) clock signals in operation. A common approach for generating the required clock signal utilizes a voltage controlled oscillator (VCO) in combination with a frequency doubling circuit for doubling the frequency of a signal from VCO to generate the required GHz clock signal. For the PCIe 4.0 standard operating at 16 Gb/s, for example, a standalone 8 GHz VCO could be utilized or a 4 GHz VCO in combination with a frequency doubling circuit utilized to generate an 8 GHz clock signal.

To lower power consumption and improve phase noise at 1 MHz, as well as to increase a tuning range for the clock signal, a 4 GHz to 6 GHz VCO is generally considered to be a good choice for generating a clock signal to cover all the standards. Where the amplitude of the signal generated by the VCO has a relatively high amplitude, as required in some applications, harmonics on the signal generated by the VCO can have sufficient magnitudes to increase the deterministic jitter caused by duty cycle error of the clock signal generated by the frequency doubling circuit. Jitter is the deviation from true periodicity of a periodic signal, and deterministic jitter is jitter that is not random but is predictable and reproducible. Deterministic jitter is proportional to the level of spurious power caused by such duty cycle errors and must be below specified threshold levels in these communication standards. There is a need for improved approaches for generating high frequency clock signals with deterministic jitter below specified threshold levels.

BRIEF SUMMARY

According to one embodiment of the present disclosure, a signal generation circuit includes a voltage controlled oscillator configured to generate a differential oscillator signal having an amplitude. A passive mixer has first differential inputs coupled to the voltage controlled oscillator to receive the oscillator signal. The passive mixer also includes second differential inputs. A filter circuit is coupled between the voltage controlled oscillator and the second differential inputs of the passive mixer. The filter circuit is configured to filter the differential oscillator signal as a function of the amplitude of the differential oscillator signal to thereby generate a filtered differential oscillator signal and to provide the filtered differential oscillator signal to the second differential inputs of the passive mixer. The passive may be a Gilbert cell mixer formed from metal-oxide-semiconductor (MOS) transistor or bipolar transistors, and may also be a passive mixer having a different topology.

DETAILED DESCRIPTION

Figure 1:
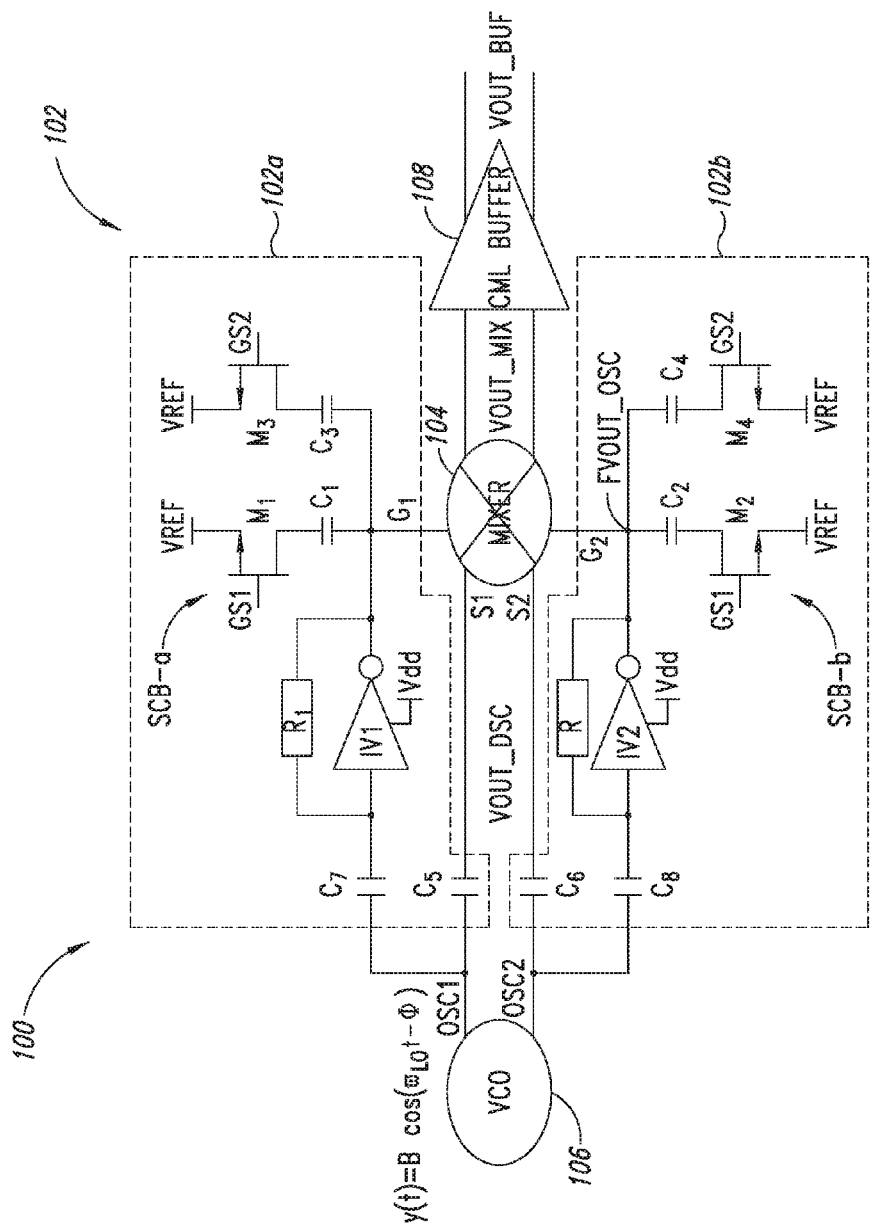
FIG. 1 is a schematic of a high frequency signal generation circuit including filter circuitry for reducing the levels of harmonics on gate inputs of a passive mixer frequency doubling circuit according to one embodiment of the present disclosure.

FIG. 1 is a schematic of a high frequency signal generation circuit 100 including filter circuitry 102 (102a and 102b) for reducing the levels of harmonics on differential inputs of a passive mixer frequency doubling circuit 104 according to one embodiment of the present disclosure. The high frequency signal generation circuit 100 includes a voltage controlled oscillator (VCO) 106 that generates an oscillator signal VOUT_OSC that is coupled to first differential inputs S1, S2 of the passive mixer frequency doubling circuit 104. The VOUT_OSC signal is also applied through the filter circuitry 102 (102a, 102b) to second differential inputs G1, G2 of the passive mixer frequency doubling circuit 104. In one embodiment, the passive mixer frequency doubling circuit 104 is formed from MOS transistors, and in such an embodiment the first differential inputs are inputs applied to the sources of some of these MOS transistors. Thus, the first differential inputs are designated S1 and S2 in FIG. 1. Similarly, in this embodiment the second differential inputs are applied to the gates of some the MOS transistors and thus the second differential inputs are designated G1 and G2 in FIG. 1. The passive mixer frequency doubling circuit 104 generates a clock signal VOUT_MIX at the desired frequency of twice the frequency fLO of the VOUT_OSC signal in response to the VOUT_OSC and filtered oscillator signal FVOUT_OSC received on the second differential inputs G1, G2, as will be described in more detail below. A current mode logic (CML) buffer 108 receives the VOUT_MIX signal from the passive mixer frequency doubling circuit 104 and generates a buffered clock signal VOUT_BUF at the frequency 2fLO that is distributed to other circuitry (not shown) for utilization therein as required. This other circuitry could, for example, be communications circuitry such as USB or PCIe communications circuitry as previously discussed.

The amplitude of the VOUT_OSC signal generated by the VCO 106 may vary significantly in different applications of the signal generation circuit 100. For example, the VOUT_OSC signal may vary from 0.7 Vpp to 2.1 Vpp. As the amplitude of the VOUT_OSC signal increases, the levels or amplitudes of harmonics of the desired VOUT_OSC signal at the frequency fLO generated by the VCO 106 increase accordingly.

The VOUT_OSC signal is a sinusoidal signal and can be given by the following equation:

$$VOUT\_OSC = B\cos(\overline{\omega}_{LO}t - \phi) \qquad \text{Eqn. 1}$$

where B is the amplitude of the signal, $\overline{\omega}_{LO}$ is the angular frequency of the signal (i.e., $\overline{\omega}_{LO} = 2\pi \times fLO$), t is time and $\phi$ the phase shift of the signal. As the amplitude of the VOUT_OSC signal increases the levels of harmonics on the second differential inputs G1, G2 increase accordingly, and the signals of these harmonics on the second differential inputs become more of a square wave signal than a sinusoidal signal. The Fourier decomposition signal f(t) of the square wave signals including these harmonics on each second differential input G1, G2 may be given by the following equation:

$$f(t) = \frac{A}{2} + \frac{2A}{\pi}\left[\cos\overline{\omega}_{LO}t - \frac{\cos 3\overline{\omega}_{LO}t}{3} + \frac{\cos 5\overline{\omega}_{LO}t}{5} + \ldots\right] \qquad \text{Eqn. 2}$$

As seen from Eqn. 2 this Fourier decomposition signal at each of the second diff inputs G1, G2 includes only a non-time varying DC component along with odd harmonics.

The VOUT_MIX signal generated by the passive mixer frequency doubling circuit 104 may be given by the following equation:

$$VOUT\_MIX(t) = \frac{AB}{2}\cos(\overline{\omega}_{LO}t - \phi) + \qquad \text{Eqn. 3}$$
$$\frac{2AB}{\pi}\cos(\overline{\omega}_{LO}t - \phi)\cos\overline{\omega}_{LO}t - \frac{2AB}{3\pi}\cos(\overline{\omega}_{LO}t - \phi)\cos 3\overline{\omega}_{LO}t + \ldots$$

where the first component is the feedthrough of the VOUT_OSC signal at frequency $\overline{\omega}_{LO}$ the second component is the second-order harmonic, and the third component is the fourth-order harmonic. The passive mixer frequency doubling circuit 104, which may be referred to simply as the "passive mixer" in the remainder of this description for the sake of brevity, functions as a frequency doubling circuit and therefore only the second-order component is of interest in the VOUT_MIX signal. The desired mixing product is the second term of Eqn. 3, by addition of the LO and LO signals. There are unwanted mixing products which arise from the third term of Eqn. 3 as well. A 4LO term is the result of mixing obtained by addition of LO+3LO. A 2LO term is the result of mixing obtained by addition of 3LO−LO. Those two unwanted terms degrade the duty cycle performance of the passive mixer 104, as will be described in more detail below. Additional higher-order terms of the square wave (5LO, 7LO . . . ) mixed with harmonics of VOUT_OSC signal (LO, 2LO, . . . ) could generate additional unwanted 2LO and 4LO contributions at the output of the mixer but with a lower amplitude.

This would be true if the VOUT_OSC signal generated by the VCO 106 were applied directly to the first differential inputs S1, S2 and second differential inputs G1, G2 of the passive mixer 104 as in conventional approaches. Instead, in the signal generation circuit 100 the filter circuitry 102 reduces the adverse effects through recombination of the frequency components at fLO and 3fLO as well as the DC components on the duty cycle of the VOUT_MIX signal generated by the passive mixer 104, as will now be described in more detail below.

The filter circuitry 102 filters first and second differential signals OSC1, OSC2 generated by the VCO 106, with the VOUT_OSC signal being the difference between these two differential signals (OSC1−OSC2)=VOUT_OSC. The filter circuitry 102 includes a first filter 102a that filters the OSC1 signal generated by the VCO 106 and includes a second filter 102b that filters the OSC2 signal generated by the VCO. The first filter 102a includes a capacitor C5 coupled between the corresponding output of the VCO and the first differential input S1 of the passive mixer 104 to filter the DC component of the OSC1 signal. In the same way, the second filter 102b includes a capacitor C6 coupled between the corresponding output of the VCO 106 and the second differential input S2 of the passive mixer 104 to filter the DC component of the OSC2 signal generated by the VCO.

The specific characteristics of the filters 102a, 102b and the associated harmonics distortion reduction performed by these filters depends on the peak-to-peak voltage swing or amplitude of the VOUT_OSC signal. Thus, the specific operational characteristics of the filters 102a, 102b are controlled as a function of the amplitude of the VOUT_OSC signal. The first filter 102a includes a capacitor C7 coupled in series with an inverter IV1 between the first output of the VCO 106 and a first one of the second differential inputs G1 of the passive mixer 104. The inverter IV1 operates to limit or clamp the amplitudes of odd harmonics (3 fLO, 5fLO, etc.) in the OSC1 signal to a supply voltage Vdd of the inverter. Thus, where the voltage swing of the OSC1 signal generated by the VCO 106 is larger than Vdd, the amplitudes of the odd harmonics in the OSC1 signal are limited to the magnitude of the supply voltage Vdd of the inverter IV1. This reduces the levels or amplitudes of odd harmonics in the OSC1 signal that are applied to the first one of the second differential inputs G1 of the passive mixer 104. The inverter IV1 also introduces a delay between the OSC1 signal from the VCO 106 and the signal applied to the second differential input G1 in response to the OSC1 signal, as will be discussed in more detail below. The inverter IV2 in the second filter 102b is coupled in series with a capacitor C8 and functions in the same way to limit the amplitude of odd harmonics in the OSC2 signal that are applied to the second one of the second differential inputs G2 of the passive mixer 104 and to introduce a delay between the OSC2 signal and the signal applied to the second one of the differential inputs in response thereto.

In operation, the first and second filters 102a, 102b reduce odd harmonics at the second differential inputs G1, G2 of the passive mixer 104 in order to reduce harmonics at (3fLO+fLO) and (3fLO−fLO) on the VOUT_MIX signal generated by the passive mixer. In the filter 102a, the inverter IV1 has three primary functions. The first function is to introduce delay between the OSC1 signal from the VCO 106 and the corresponding signal provided on the first differential input G1 of the passive mixer 104 so that the VOUT_MIX signal has sufficient amplitude. The delay of the inverter IV1, which is a CMOS inverter in one embodiment, depends on the width and length of the channel of the transistor forming the transistor and is directly linked to the technology being utilized in forming the high frequency signal generation circuit 100, as will be appreciated by those skilled in the art. The second function of the inverter IV1 is to operate in combination with a switched capacitor bank SCB-a to form a transconductance capacitive filter to remove odd harmonics at the differential input G1 of the passive mixer 104 when the amplitude of the OSC1 signal from the VCO 106 is relatively large. For example, the peak-to-peak amplitude of the VOUT_OSC signal may be a 1.5Vpp or 1.9Vpp differential signal and in this situation supply voltage Vdd of the inverter IV1 may be 0.65 V to thereby limit the amplitude of the corresponding signal applied to the differential input G1 of the passive mixer 104. Finally, the third function of the inverter IV1 is to function in combination with the feedback resistor R1 as an amplifier of the OSC1 signal when the amplitude of the VOUT_OSC signal is low, such as a less than 1 Vpp differential signal. In this third functional mode of the inverter IV1, capacitances that affect the filtering of the filter 102a are effectively removed from the filter, as will be explained in more detail below. The inverter IV2 and filter 102b operate in the same way in relation to the signal OSC2 and the second differential input G2.

The first filter 102a further includes the switched capacitor bank SCB-a coupled between a reference voltage node VREF, which is a ground node GND in one embodiment, and the second differential input G1 of the passive mixer 104. The second filter 102b similarly includes a switched capacitor bank SCB-b. In operation, these switched capacitor banks SCB-a, SCB-b set the amount of attenuation and delay introduced by the filters 102a, 102 to achieve a best trade-off between the amplitude of the VOUT_MIX signal generated by the passive mixer 104 and the duty cycle error of this signal, as will be described in more detail below.

The capacitor bank SCB-a includes a first capacitor C1 coupled in series with a selection transistor M1 between the reference voltage node VREF and the second differential input G1 of the passive mixer. A second capacitor C2 and a selection transistor M2 are coupled in the same way between second differential input G2 and the VREF node in the switch capacitor bank SCB-b. The capacitor bank SCB-a further includes a capacitor C3 coupled in series with a second selection transistor M3 between the reference voltage node VREF and the differential input G1 of the passive mixer. In the filter 102b, a capacitor C4 and a selection transistor M4 are coupled in the same way between differential input G2 and the reference voltage node VREF in the switch capacitor bank SCB-b. The selection transistors M1, M2 are controlled by a gate selection signal GS1 and selection transistors M2, M4 controlled by a gate selection transistor GS2.

In operation, external circuitry (not shown) sets the gate selection signals GS1, GS2 to the desired values to introduce a corresponding amount of capacitance into the filters 102a, 102b to optimize or improve the duty cycle error of the VOUT_MIX signal generated by the passive mixer 104. Each of the gate selection signals GS1, GS2 is either active to turn ON the corresponding transistor M1-M4 or inactive to turn OFF the corresponding transistor. When each gate selection signal GS1, GS2 is active, the corresponding capacitor C1-C4 adds capacitance to the corresponding gate input G1, G2 to thereby affect the overall filtering characteristics of the corresponding filter 102a, 102b. Conversely, when each gate selection signal is inactive the corresponding capacitor C1-C4 is effectively removed from the corresponding filter 102a, 102b and in this way removes capacitance on the corresponding gate input G1, G2 to thereby affect the overall filtering characteristics of the corresponding filter 102a, 102b. Thus, in the embodiment of FIG. 1, four different levels for the capacitance provided by the switched capacitor banks SCB-a, SCB-b may be provided through the gate selection signals GS1, GS2 corresponding to the four different states of these two signals (i.e., <00>, <01>, <10> and <11>).

As described above, each of the filters 102a, 102b removes odd harmonics at the second differential inputs G1, G2 of the passive mixer 104 when the amplitudes of the OSC1, OSC2 signals from the VCO 106 are relatively large. In this situation, the inverter IV1, IV2 operates in combination with the corresponding switched capacitor bank SCB-a, SCB-b to form a transconductance capacitive filter to remove the odd harmonics at the second differential inputs G1, G2. The gate selection signals GS1, GS2 are set at one of the four possible values for these signals based on the peak-to-peak amplitude of the VOUT_OSC signal from the VCO 106. When the peak-to-peak amplitude of the VOUT_OSC signal is relatively small, each of the inverters IV1, IV2 functions in combination with the corresponding feedback resistor R1, R2 as an amplifier of the corresponding OSC1, OSC2 signal from the VCO 106. In this mode of operation, which corresponds to the third functional mode described above, the gate selection signals GS1, GS2 are both inactive <0,0> such that all the selection transistors M1-M4 are turned OFF to thereby effectively remove all of the capacitors C1-C4 from the filters 102a, 102b. The switched capacitor banks SCB-a, SCB-b could also be formed from different circuitry and different types of transistors in other embodiments of the switched capacitor banks, as will be appreciated by those skilled in the art.

Figure 2:
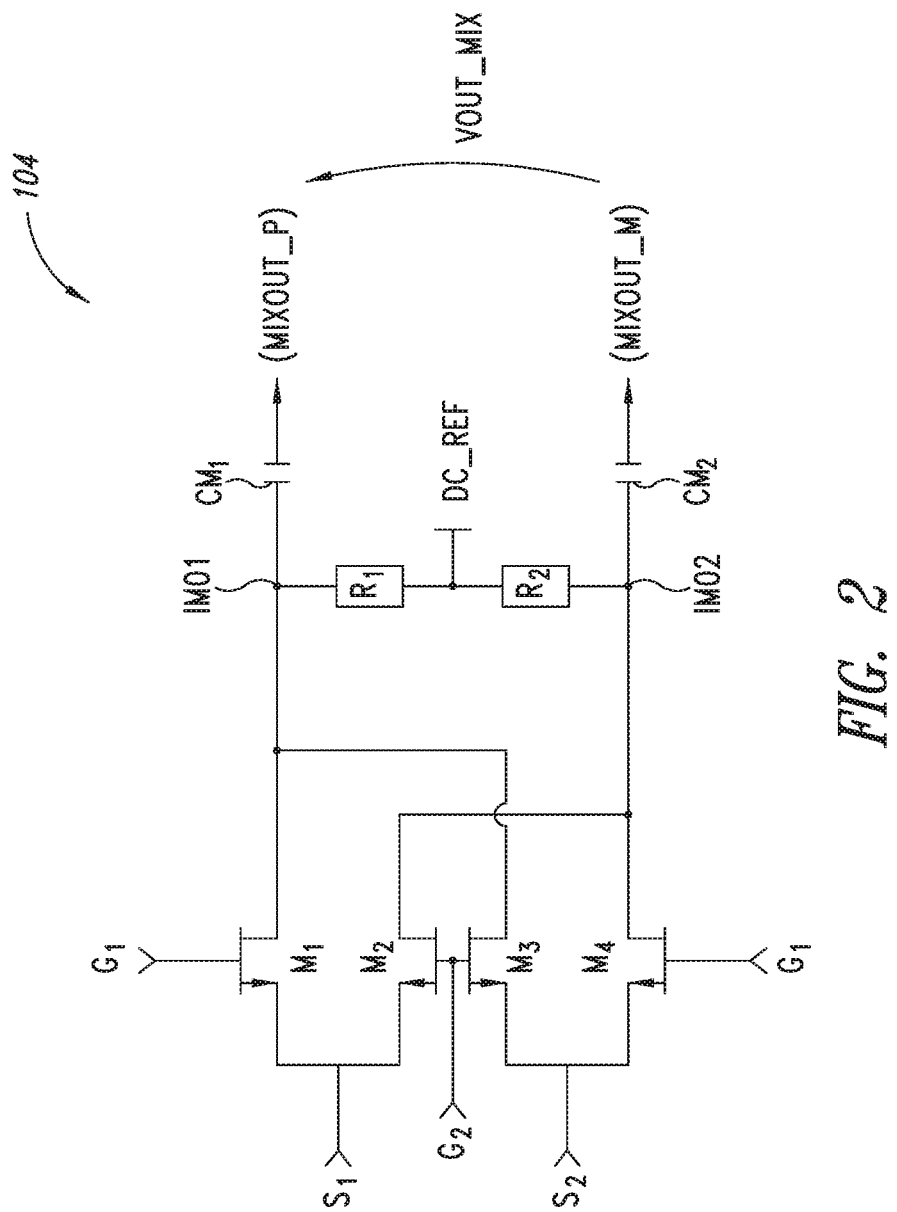
FIG. 2 is a more detailed schematic of one embodiment of the passive mixer frequency doubling circuit of FIG. 1.

FIG. 2 is a more detailed schematic of one embodiment of the passive mixer frequency doubling circuit 104 of FIG. 1. In the embodiment of FIG. 2, the passive mixer frequency doubling circuit 104 is a Gilbert cell passive mixer formed by MOS transistors M1-M4 connected as shown. The sources of transistors M1, M2 form a first source input S1 of the passive mixer 104 while the sources of transistors M3, M4 form a second source input S2 of the passive mixer. The source inputs S1, S2 are the first differential inputs of the passive mixer 104 in the embodiment of FIG. 2. The gates of transistors M1 and M4 form a first gate input G1 of the passive mixer 104 while the gates of transistor M2 and M3 form a second gate input G2. The gate inputs G1, G2 are the second differential inputs of the passive mixer 104 in the embodiment of FIG. 2. A DC biasing network including resistors R1 and R2 is connected between a reference voltage node that receives a reference voltage DC_REF and intermediate output nodes IMO1, IMO2. DC blocking capacitors CM1, CM2 are connected between the intermediate output nodes IMO1, IMO2 and the output nodes MIXOUT_P, MIXOUT_M of the passive mixer 104 and function to remove any DC component present on the intermediate output nodes from the VOUT_MIX signal across the output nodes MIXOUT_P, MIXOUT_M. In this way the impact of DC components of the VOUT_MIX signal (see first component of Eqn. 3) on duty cycle is removed by the mixer capacitors CM1, CM2. The detailed structure and operation of Gilbert Cell mixers such as that shown in FIG. 2 will be understood by those skilled in the art and therefore, for the sake of brevity, will not be described in more detail herein. Furthermore, although the passive mixer frequency doubling circuit 104 of FIG. 2 is formed from MOS transistors M1-M4, other types of transistors and other devices may of course be utilized in forming such a Gilbert cell mixer, as will be appreciated by those skilled in the art. The transistor M1-M4 could, for example, be bipolar transistors. The passive mixer frequency doubling circuit 104 also could be formed through a mixer having a different structure or topology, namely different than the Gilbert cell topology of FIG. 2.

Figure 3:
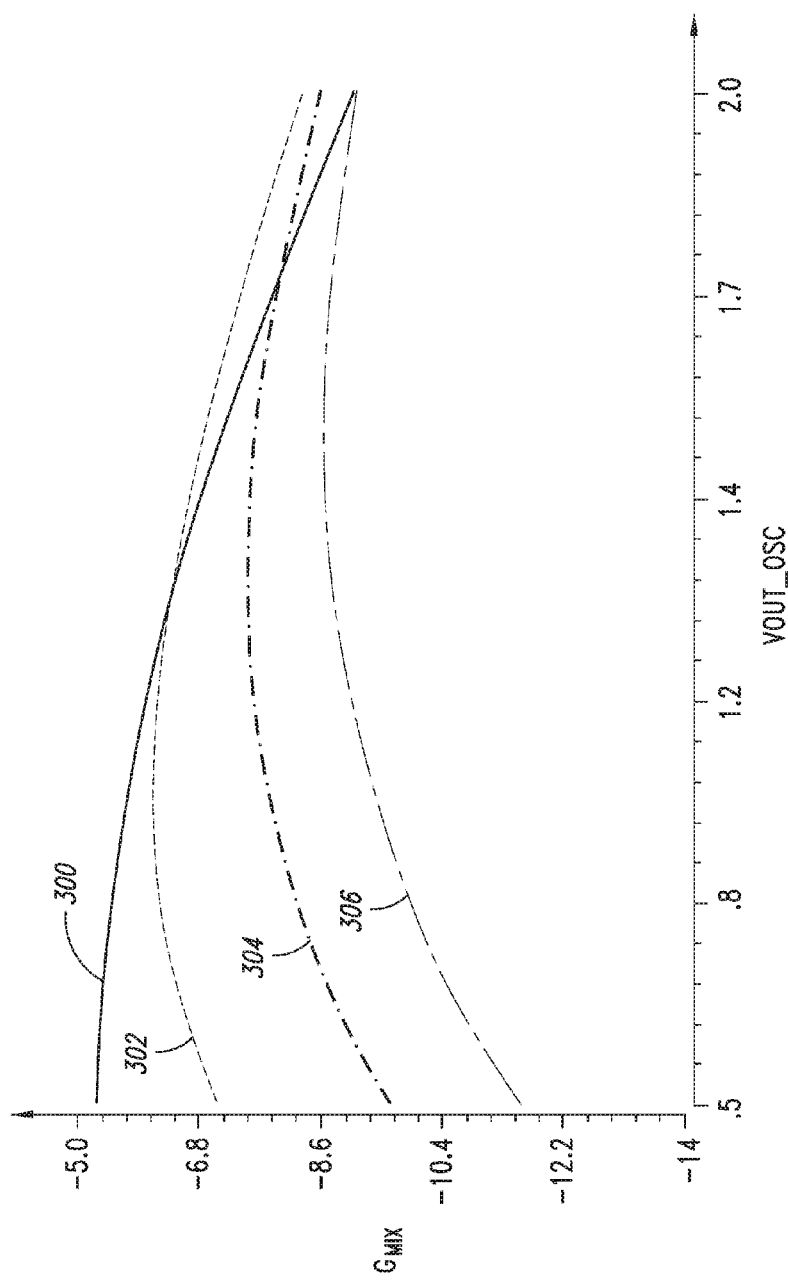
FIG. 3 is a graph showing the gain of the passive mixer frequency doubling circuit of FIGS. 1 and 2 for different values of the gate selection signals in the filter circuitry of FIG. 1.

FIG. 3 is a graph showing the gain of the passive mixer frequency doubling circuit of FIGS. 1 and 2 for different values of the gate selection signals in the filter circuitry of FIG. 1. The horizontal axis is peak-to-peak amplitude of the VOUT_OSC signal from the VCO 106 (FIG. 1) and the vertical axis is the gain GMIX of the passive mixer 104 given by the VOUT_MIX signal provided by the passive mixer divided by the VOUT_OSC signal input to the passive mixer (VOUT_MIX/VOUT_OSC). In FIG. 3 the lines 300, 302, 304 and 306 show the gain G of the passive mixer 104 when the gate selection signals GS1, GS2 are <00>, <01>, <10> and <11>, respectively. When the gate selection signals GS1, GS2 are <00> and the amplitude of the VOUT_OSC signal is greater than 1.1 Vpp differential then the compression point of the passive mixer 104 is reached and the gain of the mixer becomes non-linear. The Vpp differential is the peak-to-peak amplitude difference between the OSC1 and OSC2 signals from positive to negative, as will be understood by those skilled in the art. The compression point is a measure of the maximum amplitude of the VOUT_OSC signal for which the passive mixer 104 provides linear operation in terms of constant conversion loss, where conversion loss is the ratio of the input power of the VOUT_OSC signal to the output power of the VOUT_MIX signal. In this situation third-order harmonics at the gate inputs G1, G2 of the passive mixer 104 are relatively large. In contrast, when the gate selection signals GS1, GS2 are <11> and the VOUT_OSC signal is greater than 1.6 Vpp differential, the gain GMIX of the passive mixer 104 decreases by about 3.5 dB relative to gain when GS1, GS2 are <00> and the third-order harmonics on the gate inputs G1, G2 of the passive mixer are about 11 dB lower.

Figure 4:
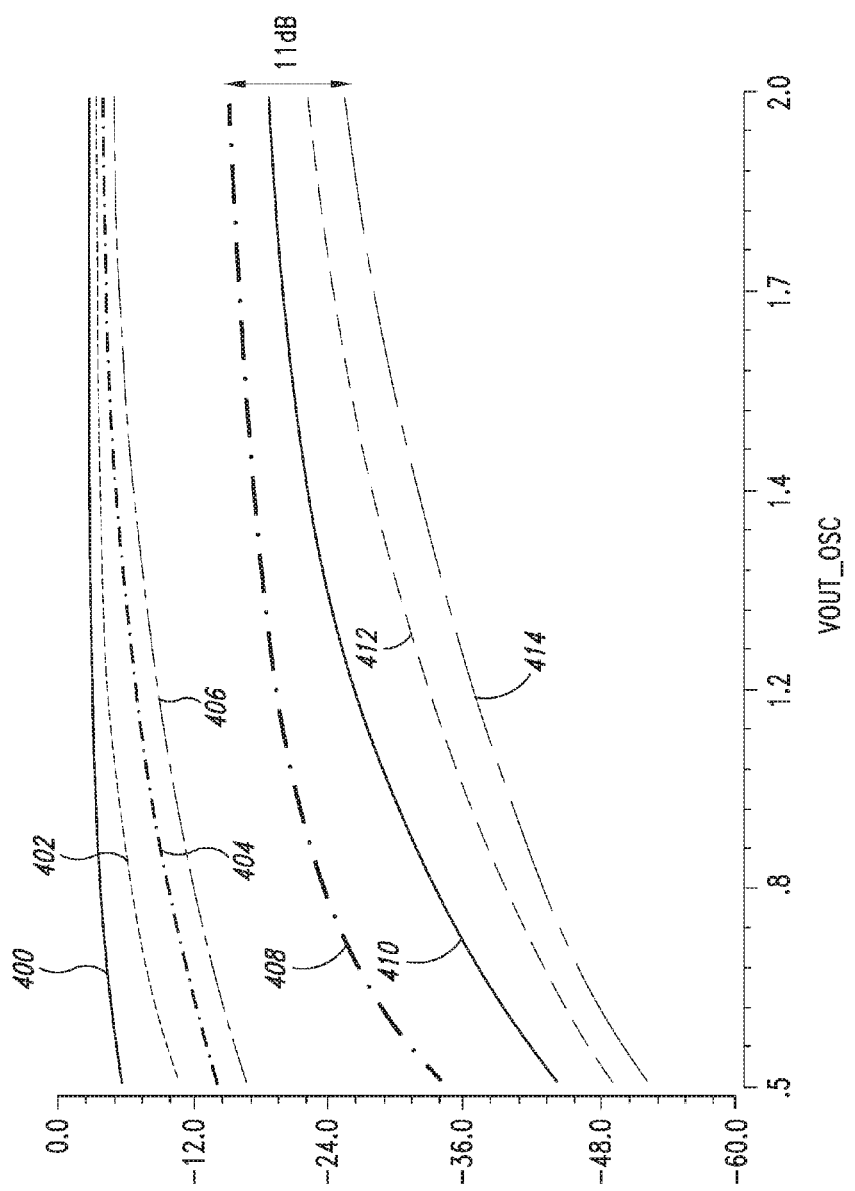
FIG. 4 is a graph showing the reduction in odd harmonics on the gate inputs of the passive mixer frequency doubling circuit of FIG. 2 for different values of the gate selection signals in the filter circuitry of FIG. 1.

FIG. 4 is a graph showing the reduction in odd harmonics on the gate inputs G1, G2 of the passive mixer frequency doubling circuit 104 of FIG. 2 for different values of the gate selection signals GS1, GS2 in the filter circuitry 102 of FIG. 1. The horizontal axis is peak-to-peak amplitude of the VOUT_OSC signal from the VCO 106 (FIG. 1) and the vertical axis is the levels of feedthrough or first-order harmonics and third-order harmonics on the gate inputs G1, G2 of the passive mixer 104. The lines 400-406 show levels of the first-order harmonics and lines 408-414 show levels of the third-order harmonics on the gate inputs G1, G2 of the passive mixer 104 for the four different states <00>, <01>, <10> and <11> of the gate selection signals GS1, GS2 applied to the filter circuitry 102. When the gate selection signals GS1, GS2 are <00> then third-order harmonics at gate input G1 of the passive mixer 104 shown by line 408 become significant when the VOUT_OSC signal is greater than 1.1 Vpp differential. In contrast, when the gate selection signals GS1, GS2 are <11> then third-order harmonics at gate input G1 of the passive mixer 104 are significantly reduced even when the VOUT_OSC signal is greater than 1.6 Vpp differential. There is an approximately 11 dB difference in the third-order harmonic levels when the gate selection signals GS1, GS2 are <00> versus <11> as indicated in FIG. 4.

Figure 5:
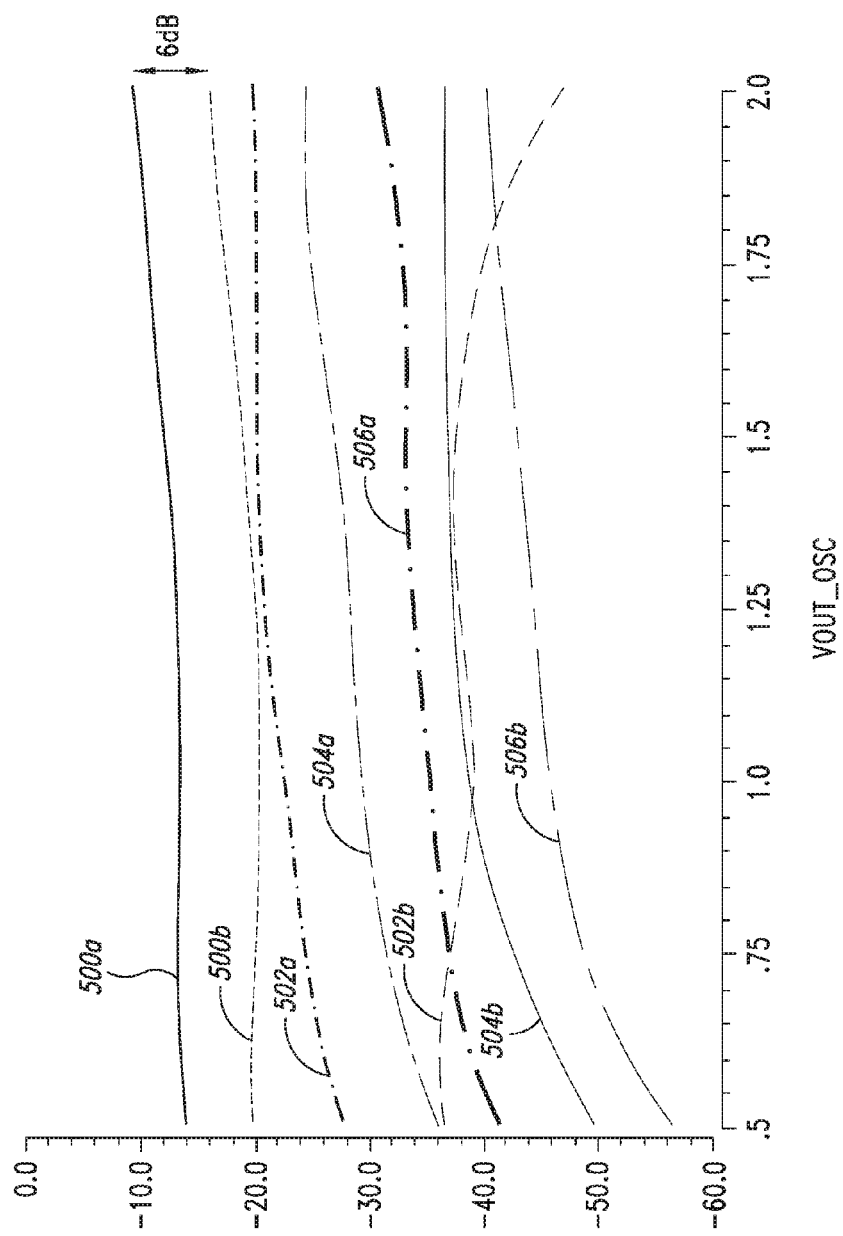
FIG. 5 is a graph showing even harmonics generated at the output of the passive mixer frequency doubling circuit of FIG. 2 as a function of the amplitude of the oscillator signal generated by the voltage controlled oscillator of FIG. 1.

FIG. 5 is a graph showing even harmonics generated at the output of the passive mixer frequency doubling circuit 104 of FIG. 2 as a function of the amplitude of the VOUT_OSC signal generated by the VCO 106 of FIG. 1. The lines 500a, 500b show fourth-order harmonic levels, lines 502a, 502b show sixth-order harmonic levels, lines 504a, 504b show eighth-order harmonics levels, and lines 506a, 506b show tenth-order harmonics levels contained on the VOUT_MIX signal generated by the passive mixer 104. As seen in the figure, the fourth-order harmonics levels 500a-b are the most significant in that they have the greatest magnitude. As seen in the figure, the filter circuitry 102 significantly reduces the levels of all of these harmonics, most significantly the fourth-order harmonics indicated by lines 500a-b. The line 500a shows the fourth-order harmonic levels when the gate selection signals GS1, GS2 are equal to <00> while the 500b shows the fourth-order harmonic levels when the gate selection signals GS1, GS2 are equal to <11>. The filter circuitry 102 accordingly provides an approximately 6 dB reduction in the fourth-order harmonic levels contained on the VOUT_MIX signal generated by the passive mixer 104.

Figure 6:
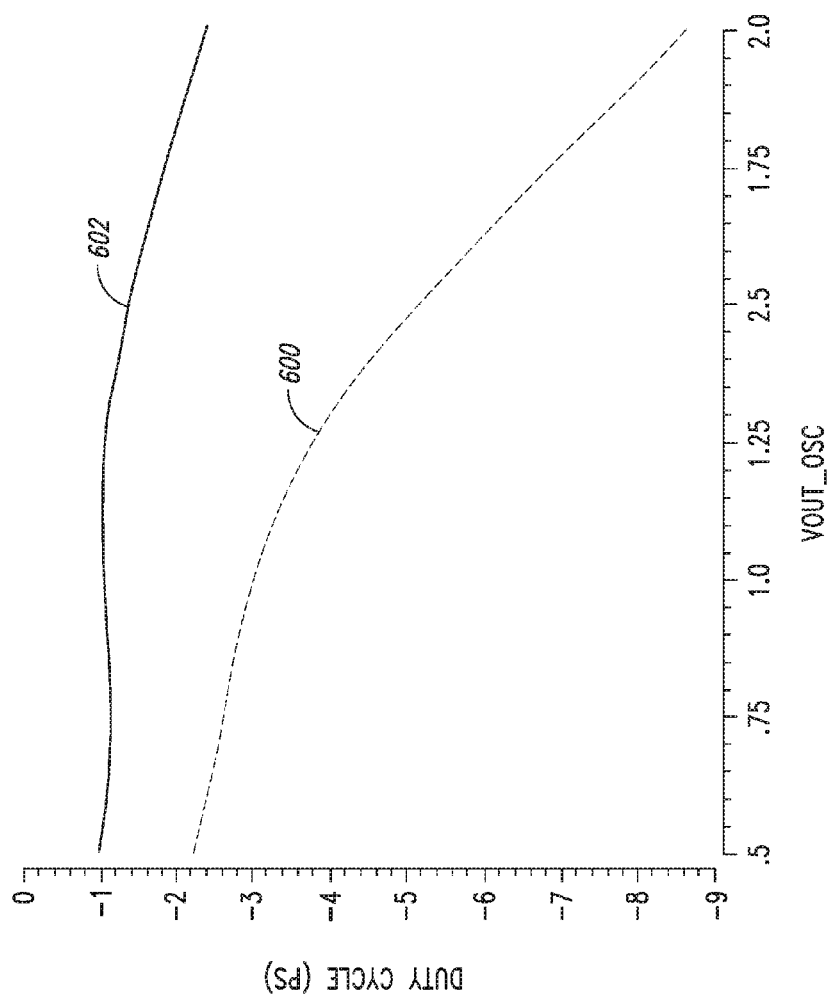
FIG. 6 is a graph showing the effect of even harmonics on the duty cycle of the output signal generated by the passive mixer frequency doubling circuit of FIG. 2.

FIG. 6 is a graph showing the effect of even harmonics, primarily the fourth-order harmonic, on the duty cycle of the output signal VOUT_MIX generated by the passive mixer frequency doubling circuit 104 of FIG. 2. The duty cycle in picoseconds is shown along the vertical axis while the peak-to-peak differential amplitude of the VOUT_OSC signal generated by the VCO 106 is shown along the horizontal axis. The line 600 shows the variation in the duty cycle of the VOUT_MIX signal as a function of the amplitude of the VOUT_OSC signal when the gate selection signals GS1, GS2 are <00>. As seen by this line 600, as the amplitude of the VOUT_OSC signal increases the variation in the duty cycle of the VOUT_OSC signal become significant. The line 602 shows the variation in the duty cycle of the VOUT_MIX signal as a function of the amplitude of the VOUT_OSC signal when the gate selection signals GS1, GS2 are <11>. In this situation, the filter circuitry 102 couples the maximum capacitance values to the gate inputs G1, G2 of the passive mixer 104 as previously described with reference to FIG. 1. The line 602 shows that the filter circuitry 102 greatly reduces the variation in the duty cycle of the VOUT_MIX signal when gate selection signals GS1, GS2 are <11>. The filter circuitry 102 functions to reduce the levels of even-order harmonics on the VOUT_OSC signal from the passive mixer 104 and in this way reduces the variation in the duty cycle of the VOUT_OSC signal even as the amplitude of the VOUT_OSC signal varies.

Figure 7:
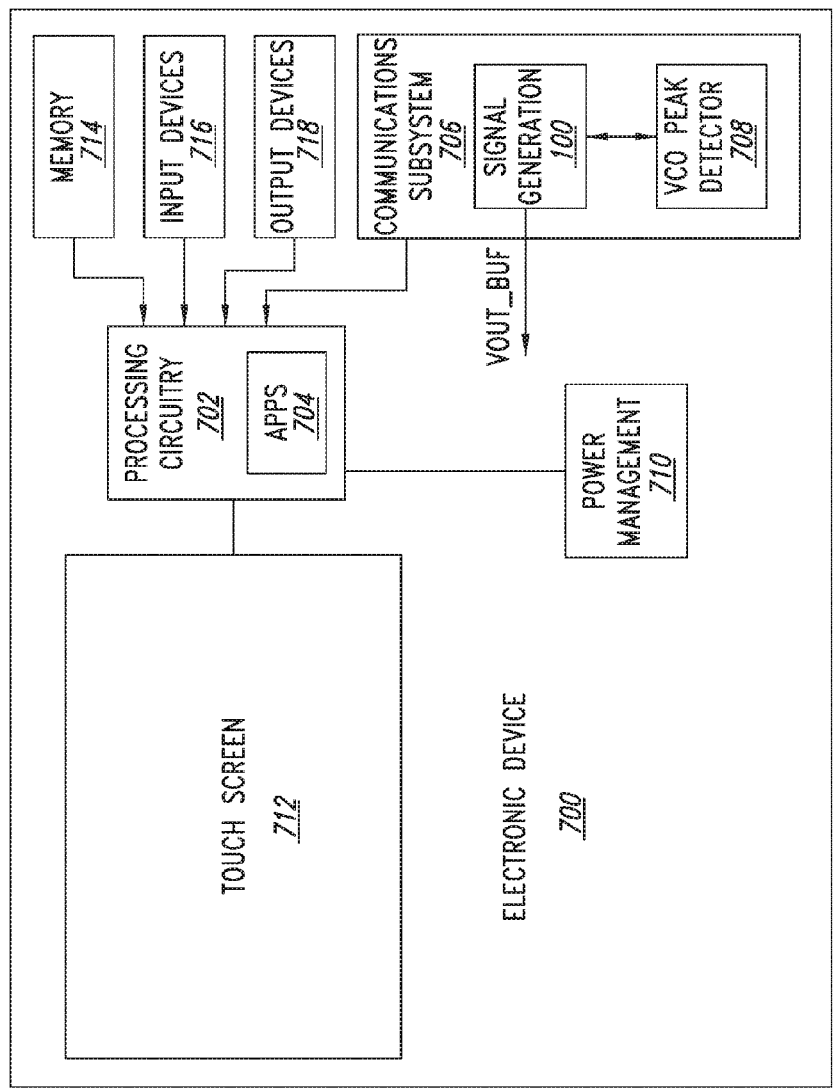
FIG. 7 is a functional block diagram of an electronic device including the high frequency signal generation circuit of FIG. 1 according to another embodiment of the present disclosure.

FIG. 7 is a functional block diagram of an electronic system or device 700 including the high frequency signal generation circuit 100 of FIG. 1 according to another embodiment of the present disclosure. The electronic device 700 in the example embodiment of FIG. 7 includes processing circuitry 702 that controls the overall operation of the electronic device 700 and also executes applications or "apps" 704 that provide specific functionality for a user of the electronic device. The high frequency signal generation circuit 100 is shown as being contained in a communications subsystem 706 of the electronic device 700 and provides the generated buffered output signal VOUT_BUF to components within the communications subsystem as well as to other components in the electronic device.

The electronic device 700 may be any type of electronic device, such as a smart phone, tablet computer, laptop computer, desktop computer, other type of portable electronic device like a music player, wearable electronic device like a heart rate or activity monitor, and so on. In one embodiment, the signal generation circuit 100 is contained in a serializer/deserializer (SERDES) integrated circuit (IC) that functions as an interface for the transmission of parallel data between two points over a serial data link. The SER- DES IC thus functions as a transceiver in which the transmitter section is a serial-to-parallel converter and the receiver section is a parallel-to-serial converter. A typical SERDES IC would include multiple such interfaces. These types of SERDES ICs are utilized in a variety of different types of systems. The specific components of the electronic device 700 will of course vary depending on the type of system or device in which the SERDES IC containing the signal generation circuit 100 is utilized. Where the signal generation circuit 100 is contained in a SERDES IC, the electronic device 700 may, for example, be a Gigabit Ethernet system, a wireless network router, a fiber optic communications system, or any of a variety of different types of storage devices.

The communications subsystem 706 is coupled to the processing circuitry 702 and may include Wi-Fi, GPS, cellular and Bluetooth subsystems for providing the electronic device 700 with the corresponding functionality. In the embodiment of FIG. 7, the communications subsystem further includes a VCO peak detector 708 that controls the gate selection signals GS1, GS2 supplied to the filter circuitry 102 contained in the signal generation circuit 100. In operation, the VCO peak detector 708 detects the peak-to-peak differential voltage of the VOUT_OSC signal generated by the VCO 106 and sets the gate selection signals GS1, GS2 based upon the detected voltage of the VOUT_OSC signal. In this way, the VCO peak detector 708 controls the capacitance and thereby the filtering characteristics of the filter circuitry 102 as a function of the peak-to-peak amplitude of the VOUT_OSC signal generated by the VCO 106. This control by the VCO peak detector 708 minimizes or reduces the duty cycle error of the VOUT_MIX signal and thereby the VOUT_BUF signal by adjusting the values of the gate selection signals GS1, GS2 and thereby the capacitance of the filter circuitry 102 to optimal values based upon the actual peak-to-peak amplitude of the VOUT_OSC signal being supplied to the passive mixer 104 from the VCO 106. As previously mentioned, the amplitude of the VOUT_OSC signal will vary in different applications and the VCO peak detector 708 thus enables the duty cycle error of the VOUT_BUF signal to be minimized or reduced regardless of the amplitude of the VOUT_OSC signal.

The electronic device 700 further includes a power management subsystem 710 coupled to the processing circuitry 502 and would also typically be coupled to other circuitry in the electronic device. The power management subsystem 710 would typically include a battery for powering the electronic device 700 and also control circuitry for controlling power-related operating modes of the electronic device such as charging of the battery, power-savings modes, and so on. The electronic device 500 further includes a video component such as a touch screen 712 that includes a touch display (not shown) like a liquid crystal display (LCD) and a touch panel (not shown) attached to or formed as an integral part of the touch display. In operation, the touch screen 712 senses touches of a user of the electronic device 700 and provides sensed touch information to the processing circuitry 702 to thereby allow a user to interface with and control the operation of the electronic device. The processing circuitry 702 also controls the touch screen 712 to display desired visual content on the touch display portion of the touch screen.

The electronic device 700 further includes data storage or memory 714 coupled to the processing circuitry 702 for storing and retrieving data including the apps 704 and other software executing on the processing circuitry and utilized by the electronic device 700 during operation. Examples of typical types of memory 714 include solid state memory such as DRAM, SRAM and FLASH, solid state drives (SSDs), and may include any other type of memory suited to the desired functionality of the electronic device 700 including digital video disks (DVDs), compact disk read-only (CD-ROMs), compact disk read-write (CD-RW) memories, magnetic tape, hard and floppy magnetic disks, tape cassettes, and so on.

Input devices 716 are coupled to the processing circuitry 702 and may include a keypad, whether implemented through the touch screen 712 or separately, a pressure sensor, accelerometer, microphone, keyboard, mouse, digital camera to capture still and video images, and other suitable input devices. Output devices 718 are coupled to the processing circuitry 702 and may include, for example, audio output devices such as a speaker, printer, vibration device, and so on. The input devices 716 and output devices 718 collectively may include other types of typical communications ports for the electronic device 700, such as USB ports, HDMI ports, and so on. The specific type and number of input devices 716, output devices 718, communications subsystems 706, and even the specific functionality of the power management subsystem 710 will of course depend on the particular type and functionality of the electronic device 700.

The various embodiments described above can be combined to provide further embodiments. Any U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the above-described embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A signal generation circuit, comprising:
   a voltage controlled oscillator configured to generate differential oscillator signals having a differential amplitude;
   a passive mixer having first differential inputs coupled to the voltage controlled oscillator to receive the differential oscillator signals, the passive mixer further including second differential inputs; and
   a filter circuit coupled between the voltage controlled oscillator and the second differential inputs of the passive mixer, the filter circuit configured to filter the differential oscillator signals as a function of the differential amplitude of the differential oscillator signals to thereby generate filtered differential oscillator signals, and to provide the filtered differential oscillator signals on the second differential inputs of the passive mixer.

2. The signal generation circuit of claim 1, wherein the passive mixer comprises a Gilbert cell mixer.

3. The signal generation circuit of claim 1, wherein the filter circuit is configured to filter a non-time varying component and odd harmonics of the filtered differential oscillator signal applied on the second differential inputs of the passive mixer.

4. The signal generation circuit of claim 3,
wherein the voltage controlled oscillator provides a first one of the differential oscillator signals on a first output and a second of the different oscillator signals on a second output;
wherein the filter circuit comprises a first filter coupled between the first output of the voltage controlled oscillator and a first one of the second differential inputs of the passive mixer;
wherein the filter circuit comprises a second filter coupled between the second output of the voltage controlled oscillator and a second one of the second differential inputs of the passive mixer; and
wherein each of the first and second filter is configured to receive selection signals having values that are a function of the differential amplitude of the differential oscillator signals, the selection signals setting the filtering characteristics of the first and second filters.

5. The signal generation circuit of claim 4, where each of the first and second filters comprises:
a first filter capacitor coupled in series with an inverter between the corresponding output of the voltage controlled oscillator and the corresponding second differential input of the passive mixer;
a resistive element coupled in parallel with the inverter; and
a switched capacitor bank coupled between the corresponding second differential input of the passive mixer and a reference node, the switched capacitor bank including a plurality of switch capacitors and configured to couple selected ones of the switch capacitors between the corresponding second differential input and the reference node responsive to the selection signals.

6. The signal generation circuit of claim 5, wherein the switched capacitor bank comprises:
a first switch capacitor coupled in series with a first transistor between the corresponding second differential input and the reference node, the first transistor including a control node configured to receive a first one of two selection signals; and
a second switch capacitor coupled in series with a second transistor between the corresponding second differential input and the reference node, the second transistor including a control node configured to receive a second one of the two selection signals.

7. The signal generation circuit of claim 6, wherein the inverter receives a supply voltage and is configured to limit the amplitude of the corresponding differential oscillator signal that is applied on the corresponding second differential input of the passive mixer where a peak-to-peak voltage of the corresponding differential oscillator signal is greater than the supply voltage of the inverter.

8. The signal generation circuit of claim 7, wherein the inverter is further configured to operate in combination with the resistive element to amplify the corresponding differential oscillator signal where the peak-to-peak voltage of the corresponding differential oscillator signal is less than a threshold.

9. The signal generation circuit of claim 8, wherein the two selection signals are inactive to turn off each of the first and second transistors if the peak-to-peak voltage of the corresponding differential oscillator signal is less than the threshold.

10. The signal generation circuit of claim 1, further comprising a current mode logic buffer coupled to outputs of the passive mixer.

11. An electronic device, comprising:
a signal generation circuit including,
a voltage controlled oscillator configured to generate differential oscillator signals having a differential amplitude;
a passive mixer having first differential inputs coupled to the voltage controlled oscillator to receive the differential oscillator signals, the passive mixer further including second differential inputs and an output; and
a filter circuit coupled between the voltage controlled oscillator and the second differential inputs of the passive mixer, the filter circuit configured to filter the differential oscillator signals as a function of the differential amplitude of the differential oscillator signals to thereby generate filtered differential oscillator signals, and to provide the filtered differential oscillator signals on the second differential inputs of the passive mixer;
a peak detector circuit coupled to the voltage controlled oscillator and configured to detect a peak-to-peak differential amplitude of the differential oscillator signals and to control filtering characteristics of the filter circuit as a function of the detected peak-to-peak differential amplitude of the differential oscillator signals; and
electronic circuitry coupled to the signal generation circuit to receive a signal provided at the output of the passive mixer.

12. The electronic device of claim 11, wherein the electronic circuitry comprises serializer/deserializer circuitry.

13. The electronic device of claim 12, wherein the electronic circuitry further comprises one of Gigabit Ethernet system circuitry, wireless network router circuitry, fiber optic communications system circuitry, and storage circuitry.

14. A method, comprising:
generating differential oscillator signals having a differential amplitude;
filtering the differential oscillator signals to remove a non-time varying component from each of the differential oscillator signals and thereby generate first filtered differential oscillator signals;
providing each of the first filtered differential oscillator signals to a corresponding first differential input of a passive mixer;
filtering the differential oscillator signals as a function of a differential amplitude of the differential oscillator signals to generate second filtered differential oscillator signals; and
providing each of the second filtered differential oscillator signals to a corresponding second differential input of the passive mixer.

15. The method of claim 14, wherein filtering the differential oscillator signals as a function of a differential amplitude of the differential oscillator signals to generate second filtered differential oscillator signals comprises filtering a non-time varying component and odd harmonics of the second filtered differential oscillator signals applied on the second differential inputs of the passive mixer.

16. The method of claim 15, wherein filtering a non-time varying component and odd harmonics of the second filtered differential oscillator signals applied on the second differential inputs of the passive mixer comprises controlling a capacitance at each of the second differential inputs of the passive mixer as a function of the differential amplitude of the differential oscillator signals.

17. The method of claim 16, wherein controlling a capacitance at each of the second differential inputs of the passive mixer as a function of the differential amplitude of the differential oscillator signals comprises selectively coupling individual capacitors to each of the second differential inputs of the passive mixer as a function of the differential amplitude of the differential oscillator signals.

18. The method of claim 15, wherein filtering the differential oscillator signals as a function of a differential amplitude of the differential oscillator signals to generate second filtered differential oscillator signals further comprises introducing a delay between each differential oscillator signal and the corresponding second filtered differential oscillator signal.

19. The method of claim 14, wherein filtering the differential oscillator signals as a function of a differential amplitude of the differential oscillator signals to generate second filtered differential oscillator signals comprises clamping amplitudes of each differential oscillator signal if a peak-to-peak voltage of the differential oscillator signal is greater than a threshold.

20. The method of claim 19, wherein filtering the differential oscillator signals as a function of a differential amplitude of the differential oscillator signals to generate second filtered differential oscillator signals comprises amplifying the differential oscillator signals where the peak-to-peak voltage of the differential oscillator signal is less than the threshold.

* * * * *